United States Patent [19]
Myles et al.

[11] 3,931,056
[45] Jan. 6, 1976

[54] SOLID DIFFUSION SOURCES FOR PHOSPHORUS DOPING CONTAINING SILICON AND ZIRCONIUM PYROPHOSPHATES

[75] Inventors: Thomas A. Myles, Tonawanda Township; Curtis E. Zimmer, Youngstown, both of N.Y.

[73] Assignee: The Carborundum Company, Niagara Falls, N.Y.

[22] Filed: Aug. 26, 1974

[21] Appl. No.: 500,765

[52] U.S. Cl. ................. 252/520; 106/57; 106/69; 148/189; 252/518
[51] Int. Cl.² ................. H01B 1/06; C04B 35/48; C04B 35/02; H01L 7/36
[58] Field of Search ........... 252/182, 518, 520, 500; 29/580, 581, 182.1, 582; 148/189, 186; 75/214; 106/57, 69

[56] References Cited
UNITED STATES PATENTS

| | | | |
|---|---|---|---|
| 2,794,846 | 6/1957 | Fuller | 136/89 |
| 3,354,005 | 11/1967 | Lepiane | 148/186 |
| 3,473,980 | 10/1969 | Beadle | 148/189 |
| 3,514,348 | 5/1970 | Ku | 148/188 |
| 3,540,951 | 11/1970 | Pammer | 148/189 |
| 3,630,793 | 12/1971 | Christensen | 148/188 |
| 3,849,344 | 11/1974 | McMurtry | 252/500 |
| 3,852,086 | 12/1974 | Murata | 106/286 |

Primary Examiner—Benjamin R. Padgett
Assistant Examiner—Donald P. Walsh
Attorney, Agent, or Firm—David E. Dougherty; Raymond W. Green; Herbert W. Mylius

[57] ABSTRACT

Solid diffusion sources for phosphorus doping comprise from 5 to 95 percent $SiP_2O_7$ with an inert phase of $ZrP_2O_7$. While such materials may be hot-pressed, it is preferred to cold-press and sinter to obtain diffusion source wafers of the appropriate dimensions and porosity. A preferred composition comprises from 25 to 75 weight percent $SiP_2O_7$, the balance $ZrP_2O_7$. Fabrication parameters range from about 4000 psi to about 20,000 psi pressure during cold-pressing, and from about 1080°C to about 1190°C firing temperature.

10 Claims, 4 Drawing Figures

SOLID DIFFUSION SOURCES FOR PHOSPHORUS DOPING CONTAINING SILICON AND ZIRCONIUM PYROPHOSPHATES

BACKGROUND OF THE INVENTION

In the manufacture of semiconductor devices such as microwave transistors and silicon integrated circuits, shallow phosphorus diffusion in semiconductor silicon has become important. The characterization of semiconductor bodies is influenced substantially by diffusion profiles, especially from the emitter of a n-p-n structure, and the profiles are further dependent upon the diffusion source used. Up to the present time, liquid diffusion sources have been chiefly utilized in the diffusion process since satisfactory solid phosphorus diffusion sources have been unavailable. The liquid sources which have been employed are compounds such as phosphine ($PH_3$), phosphorus pentoxide ($P_2O_5$), phosphorus oxychloride ($POCl_3$) and phosphorus chlorides ($PCl_3$ and $PCl_5$). Of these liquid sources, $POCl_3$ and $PH_3$ have most frequently been used. These five phosphorus compounds are all low melting-point substances and are in liquid or gas phases at temperatures below 650°C.

Conventional doping methods for phosphorus diffusion as performed with liquid diffusion sources are briefly, as follows. One of the compounds listed above is heated at a low temperature, below 600°C, and the phosphorus gas and/or phosphorus compound gas thus developed is introduced in a doping chamber kept at a high temperature ranging from 850°C to 1200°C. In this chamber the silicon wafers to be doped are arranged perpendicular to the phosphorus gas flow. In this method, the carrier concentration of phosphorus, p-n junction depth, and other electronic properties of the doped wafer are primarily influenced by the reaction condition between phosphorus gas and the solid silicon wafer. This reaction is further influenced by the flow rate of gas. When a uniform diffusion layer is required, a uniform flow of gas is necessary, which is quite difficult to establish. As a result, uniform diffusion of phosphorus in terms of each silicon wafer is difficult to control. This is one of the shortcomings of conventional phosphorus doping methods using liquid diffusion sources. Another deficiency of the liquid diffusion source method is inconvenience due to the dangerous nature of the liquid sources. Phosphine, phosphorus oxychloride and many other phosphorus compounds are toxic, corrosive, flammable or explosive.

While liquid diffusion sources continue to be used for the treatment or doping of semiconductor materials, the disadvantages of irregular diffusion control and high toxicity must be overcome to give a satisfactory diffusion procedure. An effective phosphorus diffusion or doping procedure for semiconductor silicon should provide: (1) a shallow phosphorus doping in silicon; (2) the doping procedure should not be complicated and should have a high reproducibility and reliability; (3) the doping procedure should be safe, even if personnel are exposed to exhaust gas during doping; (4) the diffusion sources should be economically reusable for many doping runs; and (5) a solid form of dopant source material should be utilized for greater safety, ease of handling, and convenience in use.

A number of solid diffusion sources have been developed in the past. Examples of such sources are indicated by U.S. Pat. No. 3,540,951, issued Nov. 17, 1970; U.S. Pat. No. 3,473,980, issued Oct. 21, 1969; U.S. Pat. No. 3,849,344, issued Nov. 19, 1974; and U.S. Pat. No. 3,852,086, issued Dec. 3, 1974.

In addition, prior doping techniques have included application of a doping or donor composition directly to the surface of a semiconducting material. Examples of these techniques include U.S. Pat. No. 3,514,348, issued May 26, 1970; U.S. Pat. No. 3,630,793, issued Dec. 28, 1971; U.S. Pat. No. 3,354,005, issued Nov. 21, 1967; and U.S. Pat. No. 2,794,846, issued June 4, 1957. Such techniques have suffered from a number of faults, including non-uniformity of doping, and difficulty of control of dopant concentrations and junction depth.

The method of the present invention provides solid phosphorus diffusion sources, which are non-toxic, convenient, uniform, and which may be used in a standard dopant diffusion apparatus to give precise control of the diffusion treatment of semiconductor materials.

SUMMARY OF THE INVENTION

This invention relates to a method for the preparation of a semiconductor doping composition which comprises silicon pyrophosphate, $SiP_2O_7$, and an inert refractory additive, specifically zirconium pyrophosphate, $ZrP_2O_7$. The composition is preferably formed into suitable solid diffusion sources by a cold-pressing technique, followed by sintering. Pressures of from 4,000 to 20,000 psi are employed during cold-pressing, and temperatures of from 1080°C to about 1190°C are suitable for sintering, dependent upon composition and desired end usage.

DETAILED DESCRIPTION OF THE INVENTION

Figure 1:
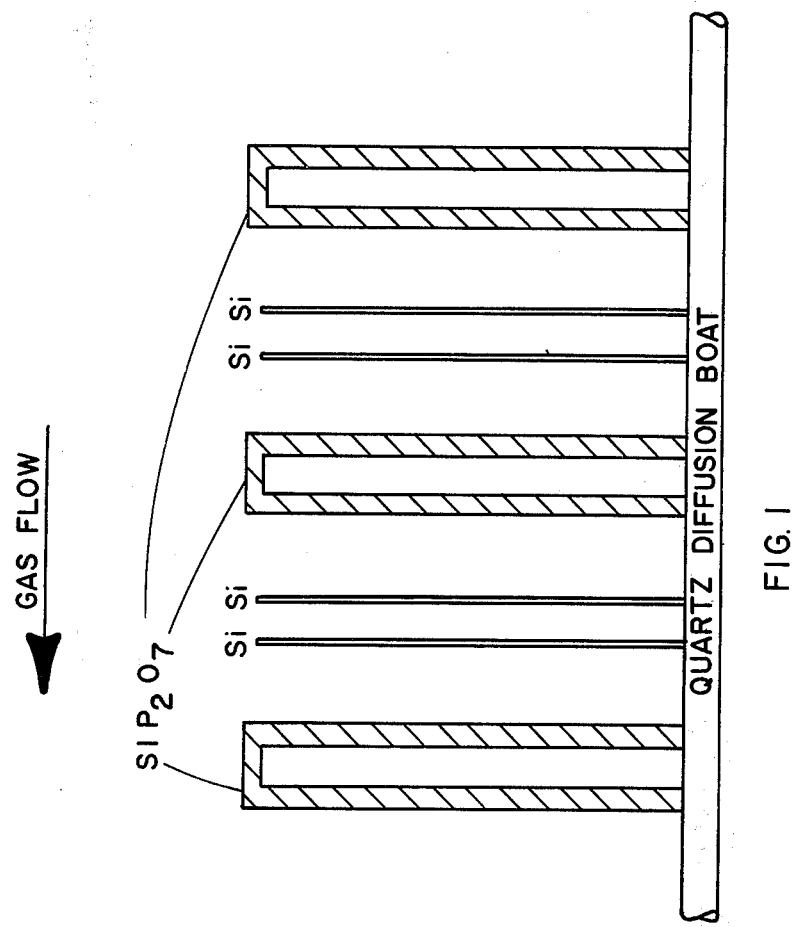
FIG. 1 represents a partial side view of a doping furnace.

The solid phosphorus containing diffusion sources of this invention are prepared in the form of thin circular disks by cold-pressing a blend of finely divided particles of $SiP_2O_7$ and $ZrP_2O_7$, and sintering the thus formed green body at a suitably elevated temperature. The body comprises essentially pure $SiP_2O_7$ with an inert phase of essentially pure $ZrP_2O_7$. It has been found quite necessary to minimize any presence of the compound $Si_2P_2O_9$ [$(SiO_2)_2 \cdot P_2O_5$] to obtain a porous body having the necessary structural integrity and sourcing capability.

In the past, phosphorus doping sources have been prepared using $SiP_2O_7$ with or without $Si_2P_2O_9$ with a high melting additive material, such as zirconium oxide, which has a melting point in excess of 2000°C. Such materials were prepared in accordance with the teachings of U.S. Pat. No. 3,852,086, by hot-pressing a slug of blended particles and cutting, such as with a diamond saw, to the desired thickness. Such a method has a number of obvious disadvantages, such as high material loss rates during machining, difficult processing, and high cost. Other problems associated with such methods include expansion of the body during hot-pressing, which occasionally results in explosions; non-homogeneous products, having a $P_2O_5$ rich center and depleted outer surface; thermal instability, as indicated by warping, thermal cracking, and blistering during doping; and non-uniform phosphorus transfer during doping. These problems are avoided by the avoidance of hot-pressing as a forming technique and use of compatible refractory filler or skeleton material to provide structural strength, although the composition of the present invention is suitable for hot-pressing. If desired, one may utilize the techniques set forth in U.S. Pat. No. 3,852,086, incorporated herein by this reference, to obtain hot-pressed solid diffusion sources consisting essentially of $SiP_2O_7$ and $ZrP_2O_7$. When utilizing the hot-pressing technique, however, a body of less than theoretical density should be produced, so as to yield a porous wafer, as hereinafter set forth.

Phosphorus doping or transfer results from the decomposition of $SiP_2O_7$ at elevated temperatures, in accordance with the formula $$SiP_2O_7 \rightarrow SiO_2 + P_2O_5.$$

Such decomposition commences at a temperature of 700°C and increases as temperature increases. Therefore, hot-pressing temperatures in excess of 1100°C can result in rapid decomposition of the silicon pyrophosphate. This decomposition is desirable during doping, but undesirable during formation for the reasons above set forth, especially in the presence of a filler material such as $ZrO_2$, which can react with $P_2O_5$ to form $ZrP_2O_7$, thus depleting the source material and causing an undesired volume change.

The advantages of cold-pressing and sintering over hot-pressing are many, including a more uniform density from center to edge of doping wafer; controlled porosity for $P_2O_5$ escape during doping; a much less expensive forming process in terms of both capital and operating costs; greater material utilization through elimination of cutting loss; and closer dimensional control.

The present process simulates a spray dried powder of the desired proportions. It has been found that the composition range of silicon pyrophosphate relative to zirconium pyrophosphate may vary widely. While 100 percent silicon pyrophosphate may be used for doping at relatively low temperatures (e.g., 700° to 900°C) this composition is not satisfactory at higher temperatures. First, pure silicon pyrophosphate softens at a relatively low temperature, thus losing structural strength at elevated temperatures. Also, the $P_2O_5$ generation from 100 percent silicon pyrophosphate is relatively rapid, and may cause problems of quantitative control. Accordingly, from 5 to 95 weight percent of zirconium pyrophosphate is used with the silicon pyrophosphate. This additive material serves both as a diluting influence upon $P_2O_5$ generation, and as a structural member at doping temperatures. While silicon pyrophosphate may be present in less than 5 percent proportion, such proportions are economically disadvantageous.

After careful evaluation of many possible additive materials, it has been determined that $ZrP_2O_7$ is particularly suitable for use with $SiP_2O_7$ in a cold-pressing technique. The principle attributes of $ZrP_2O_7$ include non-reactivity with $P_2O_5$ during decomposition of $SiP_2O_7$; resistance to decomposition to $ZrO_2$ and $P_2O_5$ through temperatures up to about 1400°C; provision of thermal stability to the cold-pressed and sintered wafer; and cold-pressing capability.

Through investigation and experimentation, it has been established that the presence of $Si_2P_2O_9$ [$(SiO_2)_2\cdot P_2O_5$] in the doping wafer results in lower softening points and inferior thermal behavior. This compound manifests itself as a pink coloration when fired to about 1100°C, and may be analytically detected by x-ray diffraction. It has been found that $SiP_2O_7$ may be prepared without the formation of undesired $Si_2P_2O_9$ by providing a rich source of $P_2O_5$ during the reaction with the $SiO_2$, and by using a rapid rate of temperature increase to achieve the reaction.

As indicated, blends of the finely powdered $SiP_2O_7$ and $ZrP_2O_7$ are formed in the desired proportions. Suitable proportions range from about 5 percent $SiP_2O_7$ and 95 percent $ZrP_2O_7$ to about 95 percent $SiP_2O_7$ and 5 percent $ZrP_2O_7$. A preferred range of proportions is from about 75 percent $SiP_2O_7$/25 percent $ZrP_2O_7$ to about 25 percent $SiP_2O_7$/75 percent $ZrP_2O_7$. The blended materials are then mixed with a suitable organic resin binding agent to lend structural strength to the green wafer.

The blended powders are placed in a die or cavity for pressing, the diameter of the cavity being essentially that of the desired finished wafer. Sufficient powder is used to yield the wafer thickness for the pressure utilized and desired density. It is noted that green density is directly proportional to applied pressure, and can be controlled thereby. Suitable pressures may range from 4,000 to 20,000 psi, with about 10,000 psi to 12,000 psi being the preferred pressure.

The cold-pressed wafer is cold-pressed to approximately the desired density and thickness, removed from the press, and then fired. The firing temperature may be varied somewhat, depending upon the specific composition, and may vary from about 1080°C to about 1190°C. For example, a wafer consisting of 100 percent $SiP_2O_7$ may be fired at from about 1080°C to about 1120°C, while a composition of 50 percent $SiP_2O_7$ to 50 percent $ZrP_2O_7$ may be fired at from 1090°C to 1190°C. Since $SiP_2O_7$ melts at about 1190°C, this temperature should not be exceeded. A temperature below 1080°C is to be avoided, since little or no bonding occurs in this temperature range. Conversely, temperatures above 1200°C should be avoided due to excessive shrinkage and warping, as well as depletion of $P_2O_5$ from the wafer. The $ZrP_2O_7$ does not have a liquid phase at doping temperatures (700° to 1200°C) and therefore serves to strengthen the wafer at elevated temperatures. Sintering times may range from about 1 hour up to 6 or more hours, and may be carried out under an inert atmosphere, such as argon or nitrogen. Air or vacuum may also be used. The parts may be fired in a conventional lab kiln, with controlled heating and cooling rates. The parts may be heated to the firing temperature over a period of from one half to three hours, and soaked at the firing temperature for fifteen minutes or longer. After soaking, the furnace is allowed to cool to room temperature.

As indicated, a temporary binder is utilized to provide additional strength to the green body. Such binders should be easily removed from the green body by volatilization during firing. This also helps to provide added porosity in the fired body, which is considered beneficial. It is known that in $P_2O_5$ source materials of this nature, $P_2O_5$ vapor is generated uniformly throughout the wafer. Therefore, interconnected porosity or channels for the passage of $P_2O_5$ vapor are necessary to prevent loss of structural integrity.

A variety of organic binders may be utilized, such as polyvinyl alcohol, starch, vinyl butyrate, methyl cellulose, and cyanoethylated cellulose. Still other suitable organic binder materials will suggest themselves to persons of ordinary skill in the art.

A suitable solvent may be employed in conjunction with the organic binder, such as acetone, acetonitride, acrylonitride, butyrolacetone, dimethylformamide, nitromethane, tetrahydrofuran, ethyl acetate, butyl acetate, etc. Still others will suggest themselves to persons of ordinary skill in the art.

The invention is further illustrated by the following Examples, although it will be understood that the Examples are intended merely for purposes of illustration and are not intended to limit the scope of the invention.

EXAMPLE 1

A dry mixture of 50 grams of $SiP_2O_7$ and 50 grams of $ZrP_2O_7$ is blended with 10 grams of a 5 percent polyvinyl alcohol solution (available from E. I. duPont Inc., under the Trademark Elvanol 51.05) and 0.6 grams of polyethylene glycol (available from Union Carbide under the Trademark Carbowax 200). The mixture is blended well, and dried at about 82°C. It is then screened through a 40 mesh U.S.S. (420 micrometer) wire screen.

A portion comprising 2.29 grams of the dried and screened material is placed into a 1 ½ inch round die, and pressed using 11,800 psi force. The pressed piece has a thickness of approximately 0.038 inches upon release. The part is then fired in a lab kiln, in accordance with the following schedule:

| Temperature | Time |
|---|---|
| Room Temp. to 1110°C | 3 hours |
| Soak at 1100°C | ½ hours |
| 1110°C to 1038°C | 8 minutes |
| 1038°C to 816°C | 10 minutes (door open) |
| Wafers Removed | |

Typical results obtained are as follows:

TABLE I

| | Typical Diffusion Source Wafers | |
|---|---|---|
| | Green | Fired |
| Thickness | 0.038 inch | 0.038 inch |
| Diameter | 1.507 inch | 1.503 inch |
| Weight | 2.287 gram | 2.069 gram (9.53% weight loss) |

Samples made in accordance with this technique are subjected to doping analysis, and produce uniform doping as outlined in the following Example.

EXAMPLE 2

Figure 2:
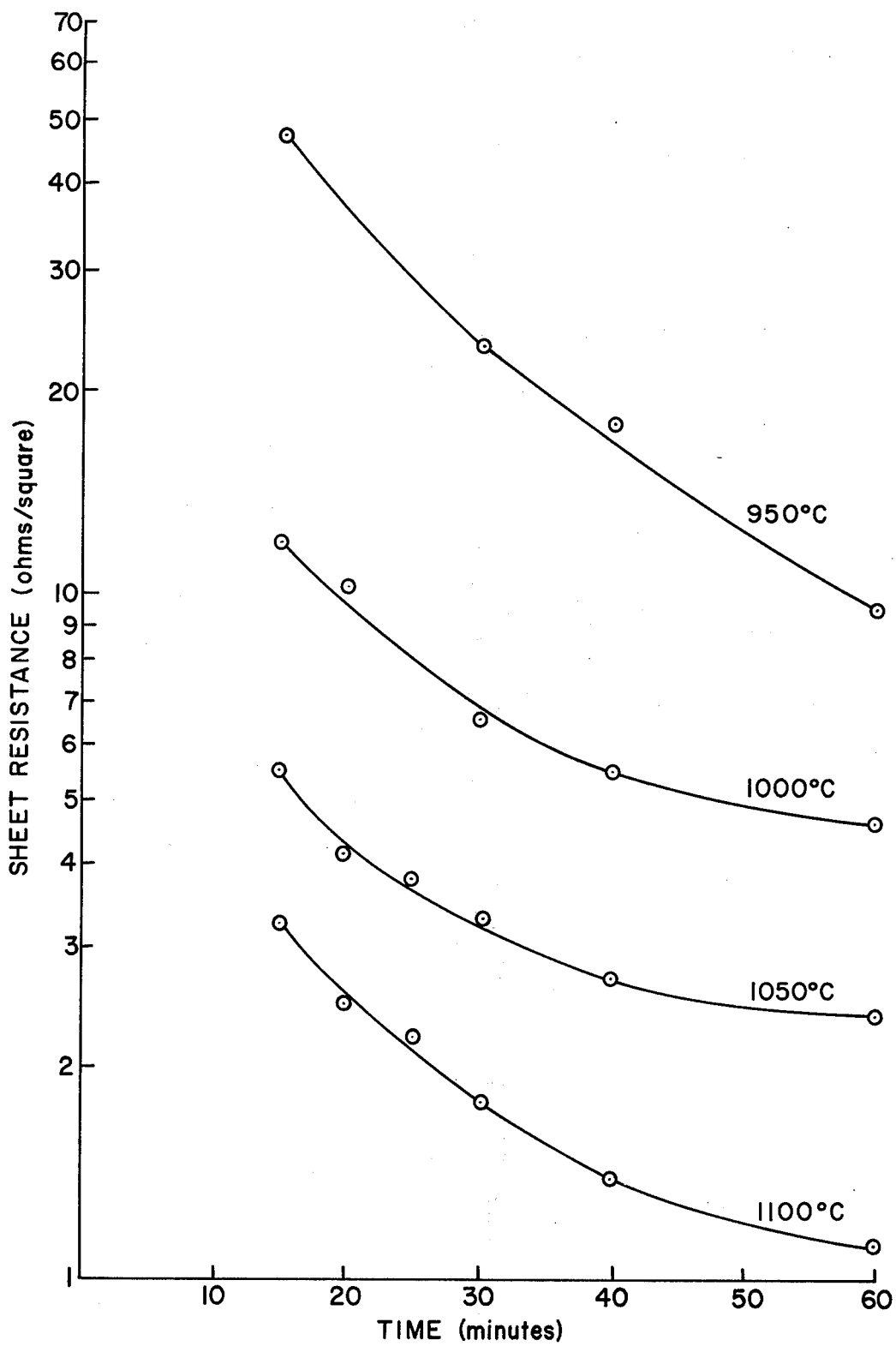
FIGS. 2–4 illustrate graphically results of doping experiments conducted with diffusion sources prepared in accordance with this invention.
Figure 3:
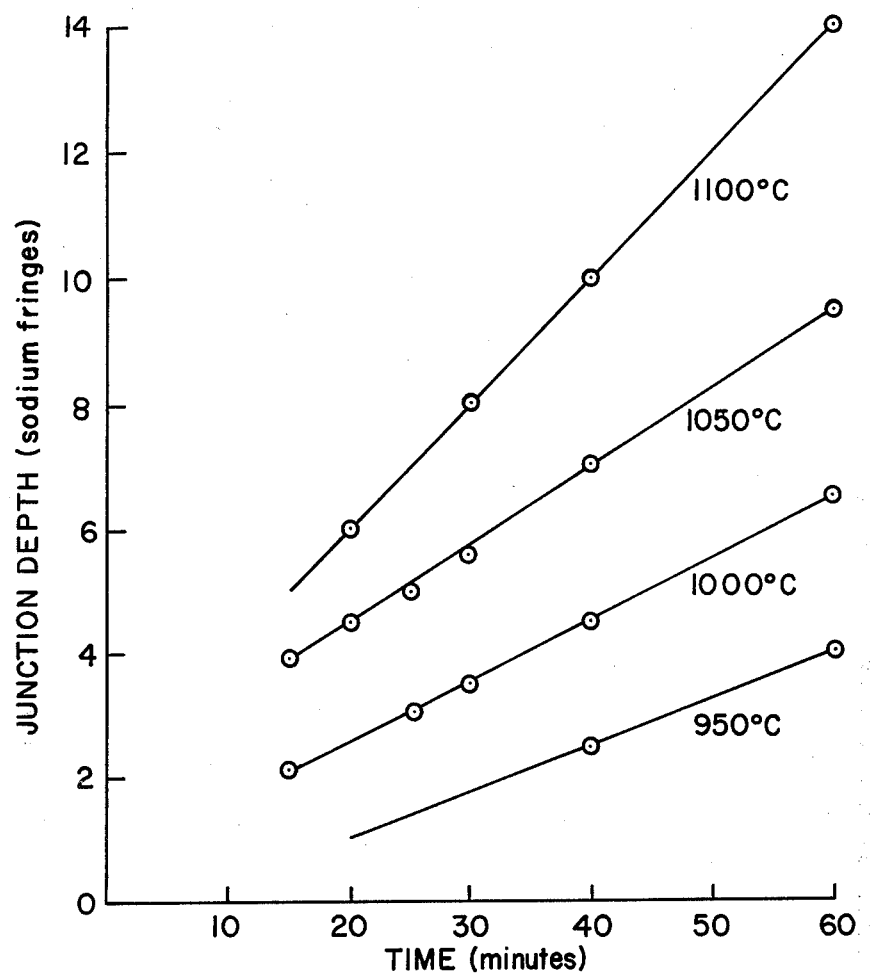
Figure 4:
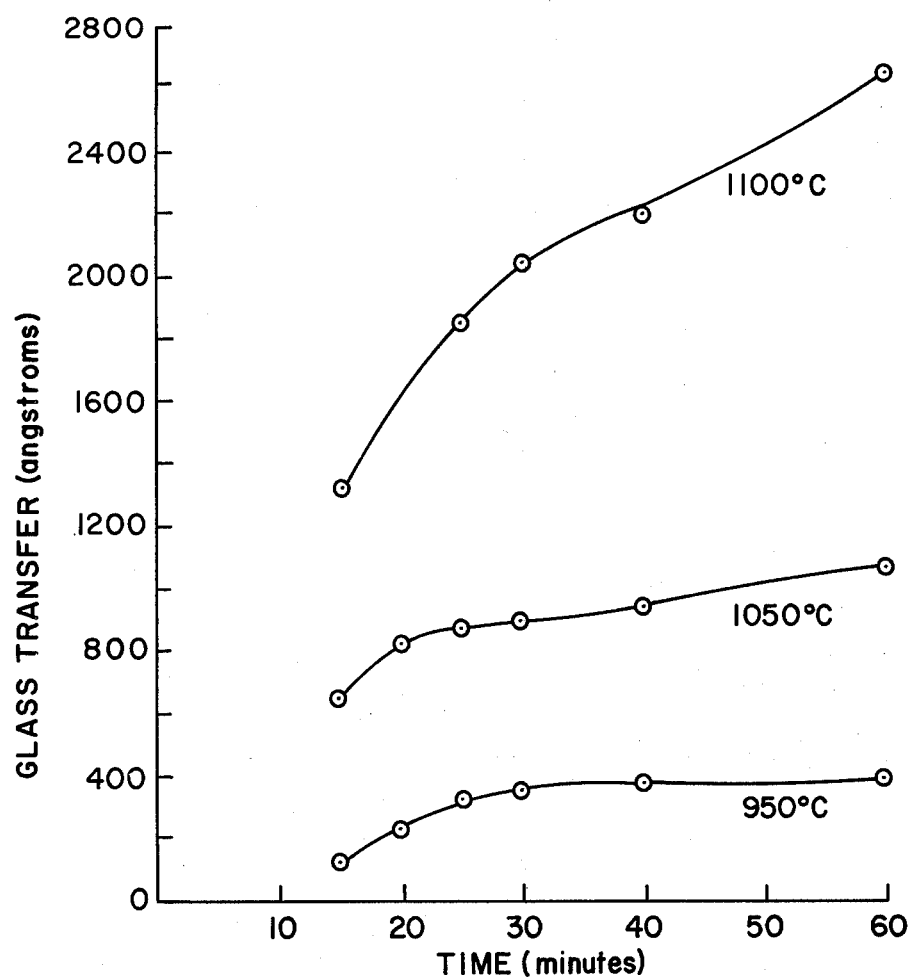

The results of phosphorus doping using solid diffusion sources prepared by the method of Example 1 are shown in FIGS. 2–4. The sheet resistance, junction depth, and glass transfer are measured as a function of time and temperature to demonstrate doping capability.

The diffusion experiments are conducted using 1 ½ inch diameter silicon epitaxial wafers which were boron doped and have a resistivity of 1.5 to 2.2 ohm-cm and a film thickness of 8 to 12 microns. The diffusions are conducted in a standard 60 mm inside diameter quartz tube furnace, available from the Thermco Company under the model designation Thermco Brute. A flow of 0.5 liters per minute of nitrogen is established. The positioning of the individual wafers is as illustrated in FIG. 1. As shown, the diffusion carrier has a phosphorus source wafer in every other slot, with two silicon wafers placed back to back spaced 125 mils (3.2 mm) from the source wafers. This type of source positioning within a tube provides a one-to-one correspondence with each silicon wafer. The active component during sourcing is $P_2O_5$, which is transported to the silicon wafer by concentration gradient diffusion. The decomposition reaction is as follows:

$$SiP_2O_7 \rightarrow P_2O_5 + SiO_2.$$

At the silicon wafer surface, a portion of the transported $P_2O_5$ reacts thusly:

$$2 P_2O_5 + 5 Si \rightarrow 5 SiO_2 + 4P.$$

The phosphorus thus formed at the surface diffuses into the silicon wafer, while the by-product silica combines with unreacted $P_2O_5$, forming the glass transfer layer.

The source wafers used are 35 mils thick and 1 ½ inches in diameter. No chemical cleaning is performed, but prior to diffusion, the source wafers are baked at 345°C for 30 minutes in nitrogen and annealed for 15 minutes in nitrogen at 1100°C.

The sheet resistance is measured using a four-point probe consisting of a linear array with 100 mm spacing and a 200 gram load. All wafers are deglazed using a standard buffered HF solution to remove the $P_2O_5$ surface layer. FIG. 2 illustrates sheet resistances obtained as a function of time for four different doping temperatures, from 950°C to 1100°C in 50°C steps. These results compare favorably with liquid sources such as $POCl_3$ and $PBr_3$.

Junction depth measurements are made using standard angle lapping and straining techniques, using a sodium light to produce interference patterns and counting the fringes to establish depth. FIG. 3 shows junction depth in sodium fringes as a function of time and temperature. Using the sheet resistance and junction depth, a surface concentration may be calculated. The surface concentration thus calculated compares favorably with the solid solubility limit of phosphorus in silicon at these temperatures.

FIG. 4 illustrates the transfer of $P_2O_5$ in Angstroms as a function of time over the range 950°C to 1100°C. The silicon test wafers have 4,800 Angstroms of thermal $SiO_2$, on top of which the $P_2O_5$ is deposited during doping. The total glass layer thickness is then measured, and 4,800 Angstroms subtracted to obtain the actual $P_2O_5$ glass transfer. Thickness measurements are made using UV-Visible reflectance techniques.

EXAMPLE 3

Solid diffusion sources are prepared in accordance with Example 1, using varying $SiP_2O_7$ concentrations. Phosphorus doping tests using these sources are conducted in accordance with Example 2 at a doping temperature of 1100°C, for one hour. Results of these tests are illustrated in Table II.

TABLE II

| Results of Doping Tests Using $SiP_2O_7$–$ZrP_2O_7$ Sources | | | | |
|---|---|---|---|---|
| Composition $SiP_2O_7$ | (Wt.%) $ZrP_2O_7$ | Sheet Resistance (ohms/ square) | Junction depth (Microns) | Glass Transfer (Angstrom Units) |
| 50 | 50 | 2.0 | 2.6 | 2400 |
| 25 | 75 | 2.0 | 2.6 | 2400 |
| 75 | 25 | 2.0 | 2.6 | 2400 |

While the invention has been described herein with reference to certain preferred embodiments, it is to be understood that various changes and modifications may be made by those skilled in the art without departing from the concept of the invention, the scope of which is to be determined by reference to the following claims.

What is claimed is:

1. A solid phosphorus containing source body for semiconductor diffusion doping, said body consisting essentially of from about 5 to about 95 percent by weight of silicon pyrophosphate and from about 95 to about 5 percent by weight of zirconium pyrophosphate.

2. A solid phosphorus body as set forth in claim 1 consisting essentially of from about 25 to about 75 percent by weight silicon pyrophosphate and from about 25 to about 75 percent by weight zirconium pyrophosphate.

3. A method for the formation of solid phosphorus diffusion bodies comprising preparing a blend consisting essentially of from 5 to 95 weight percent $SiP_2O_7$ with from 95 to 5 weight percent $ZrP_2O_7$, cold-pressing a portion of said blend to thereby form a shaped unfired body, and sintering said body at a temperature of from about 1080°C to about 1200°C.

4. A method as set forth in claim 3 wherein said cold-pressing is conducted at a pressure of from about 4,000 psi to about 20,000 psi.

5. A method as set forth in claim 4 wherein said blend consists essentially of $SiP_2O_7$ and $ZrP_2O_7$ in 1:1 proportions.

6. A method as set forth in claim 5 wherein said sintering is conducted at a temperature of from about 1090°C to about 1120°C, and said cold-pressing is conducted at a pressure of from about 10,000 psi to about 12,000 psi.

7. A method for preparing phosphorus dopants comprising $SiP_2O_7$, said method comprising the steps of:
   a. forming a blend of from about 5 to about 95 weight percent $SiP_2O_7$, the balance $ZrP_2O_7$;
   b. adding to said blend a volatilizable organic binder;
   c. pressing said blend containing said binder at a pressure of from 4,000 psi to 20,000 psi to form a wafer of the desired dimensions; and
   d. firing said wafer at an elevated temperature to volatilize said binder and form a porous wafer consisting essentially of $SiP_2O_7$ and $ZrP_2O_7$.

8. A method as set forth in claim 7 wherein said $SiP_2O_7$ is essentially free of any $Si_2P_2O_9$.

9. A method as set forth in claim 8 wherein said pressing is at a pressure of from about 10,000 psi to 12,000 psi and said firing temperature is from about 1080°C to about 1190°C.

10. A method as set forth in claim 9 wherein the initial blend consists of from 25 to 75 weight percent $SiP_2O_7$, the balance being $ZrP_2O_7$.

* * * * *